US010529823B2

(12) United States Patent
Miao et al.

(10) Patent No.: US 10,529,823 B2
(45) Date of Patent: Jan. 7, 2020

(54) METHOD OF MANUFACTURING A SEMICONDUCTOR DEVICE HAVING A METAL GATE WITH DIFFERENT LATERAL WIDTHS BETWEEN SPACERS

(71) Applicant: International Business Machines Corporation, Armonk, NY (US)

(72) Inventors: Xin Miao, Guilderland, NY (US); Kangguo Cheng, Schenectady, NY (US); Chen Zhang, Guilderland, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/991,454

(22) Filed: May 29, 2018

(65) Prior Publication Data

US 2019/0371913 A1    Dec. 5, 2019

(51) Int. Cl.
*H01L 29/66* (2006.01)
*H01L 29/423* (2006.01)
*H01L 29/78* (2006.01)
*H01L 21/28* (2006.01)
*H01L 21/8234* (2006.01)
(Continued)

(52) U.S. Cl.
CPC .. *H01L 29/66545* (2013.01); *H01L 21/28088* (2013.01); *H01L 21/28114* (2013.01); *H01L 21/28512* (2013.01); *H01L 21/823456* (2013.01); *H01L 21/823468* (2013.01); *H01L 21/823842* (2013.01); *H01L 29/42376* (2013.01); *H01L 29/4966* (2013.01); *H01L 29/517* (2013.01); *H01L 29/6653* (2013.01); *H01L 29/6656* (2013.01);
(Continued)

(58) Field of Classification Search
CPC ........... H01L 29/66545; H01L 29/6653; H01L 29/66553; H01L 29/6656; H01L 29/42376; H01L 29/7856; H01L 21/28114; H01L 21/82345; H01L 21/823456; H01L 29/42384; H01L 21/823842; H01L 21/82385; H01L 21/823468; H01L 21/823864
See application file for complete search history.

(56) References Cited

U.S. PATENT DOCUMENTS 7,488,650 B2    2/2009 Schulz
8,637,369 B2    1/2014 Magri et al.
(Continued)

*Primary Examiner* — Younes Boulghassoul
(74) *Attorney, Agent, or Firm* — Vazken Alexanian; Ryan, Mason & Lewis, LLP

(57) ABSTRACT

A method for manufacturing a semiconductor device includes forming a channel layer on a semiconductor substrate and forming at least two spacers on the channel layer. A first portion of a gate metal layer is formed between the spacers, and a dielectric layer is conformally deposited on the spacers and the first portion of the gate metal layer. In the method, part of the dielectric layer is directionally removed from surfaces which are parallel to an upper surface of the substrate. A second portion of the gate metal layer is formed between remaining portions of the dielectric layer and on the first portion of the gate metal layer, and a cap layer is deposited on the second portion of the gate metal layer. A lateral width the second portion of the gate metal layer is less than a lateral width of the first portion of the gate metal layer.

19 Claims, 5 Drawing Sheets

(51) Int. Cl.
  *H01L 29/49* (2006.01)
  *H01L 21/285* (2006.01)
  *H01L 29/51* (2006.01)
  *H01L 21/8238* (2006.01)
(52) U.S. Cl.
  CPC .... *H01L 29/6681* (2013.01); *H01L 29/66553* (2013.01); *H01L 29/7848* (2013.01)

(56) References Cited

U.S. PATENT DOCUMENTS

| | | | |
|---|---|---|---|
| 8,685,817 B1 * | 4/2014 | Cai | H01L 29/78 257/E21.205 |
| 8,772,100 B2 | 7/2014 | Huang et al. | |
| 8,778,789 B2 | 7/2014 | Besser et al. | |
| 8,796,812 B2 | 8/2014 | Tseng et al. | |
| 8,823,065 B2 | 9/2014 | Wang et al. | |
| 9,093,467 B1 * | 7/2015 | Xie | H01L 29/66545 |
| 9,202,695 B2 | 12/2015 | Togo | |
| 9,287,138 B2 | 3/2016 | Wang et al. | |
| 9,331,161 B1 | 5/2016 | Lee et al. | |
| 2006/0091432 A1 * | 5/2006 | Guha | H01L 29/78654 257/288 |
| 2013/0049142 A1 * | 2/2013 | Liu | H01L 29/4983 257/412 |
| 2014/0231885 A1 * | 8/2014 | Xie | H01L 21/823437 257/288 |
| 2014/0353734 A1 * | 12/2014 | Xie | H01L 21/283 257/288 |
| 2015/0115375 A1 * | 4/2015 | Yoo | H01L 29/517 257/411 |
| 2015/0206754 A1 * | 7/2015 | Horak | H01L 21/28008 257/288 |
| 2016/0284817 A1 * | 9/2016 | Basker | H01L 29/66545 |
| 2016/0372382 A1 * | 12/2016 | Lee | H01L 21/823842 |
| 2017/0222005 A1 | 8/2017 | Lin et al. | |
| 2019/0088759 A1 * | 3/2019 | Sung | H01L 21/28114 |

* cited by examiner

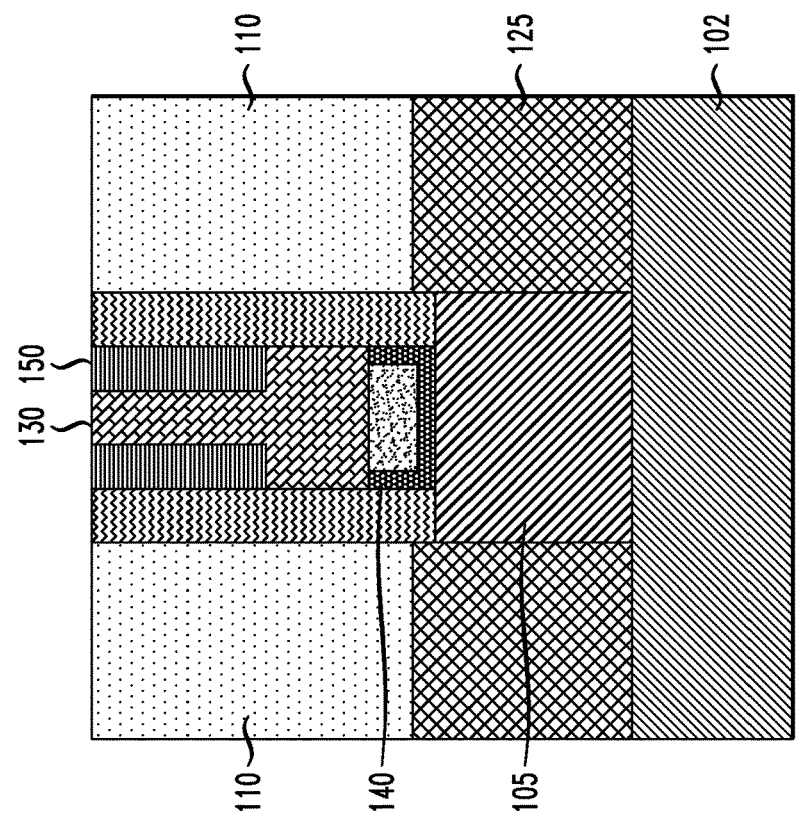
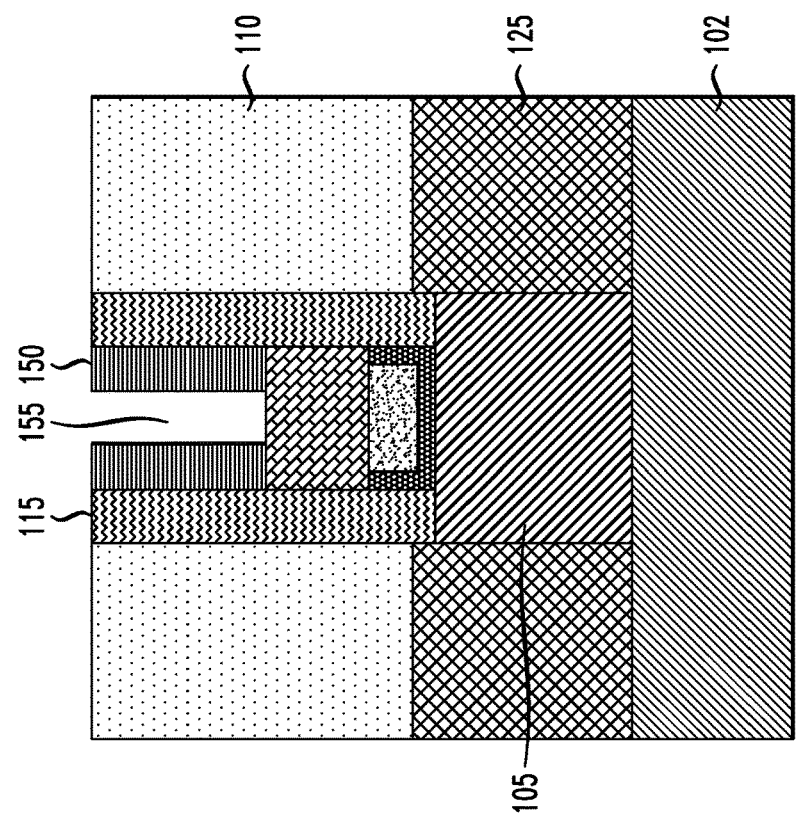

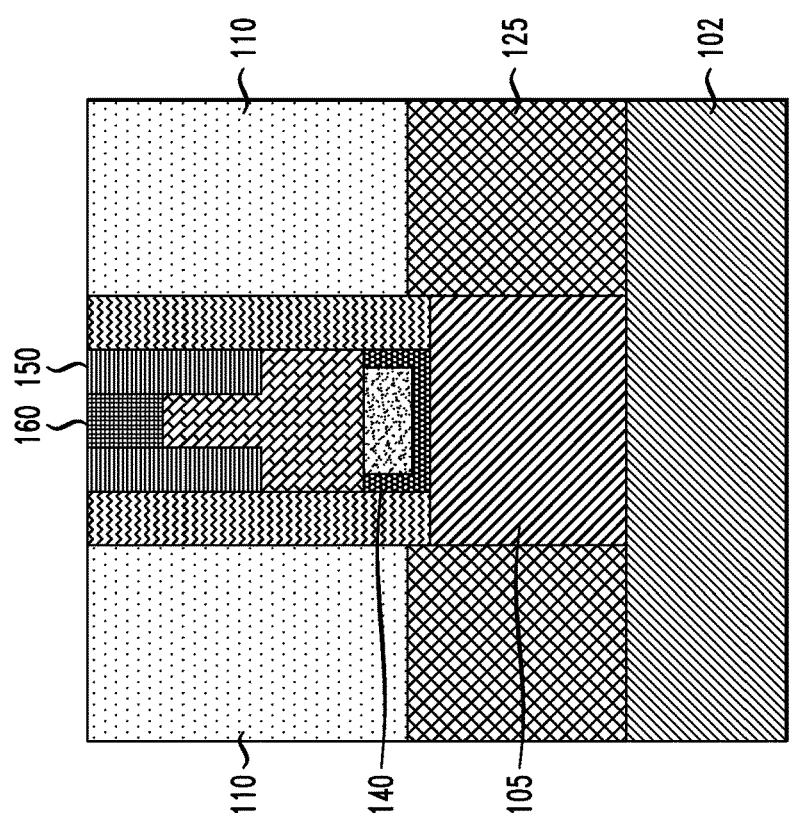
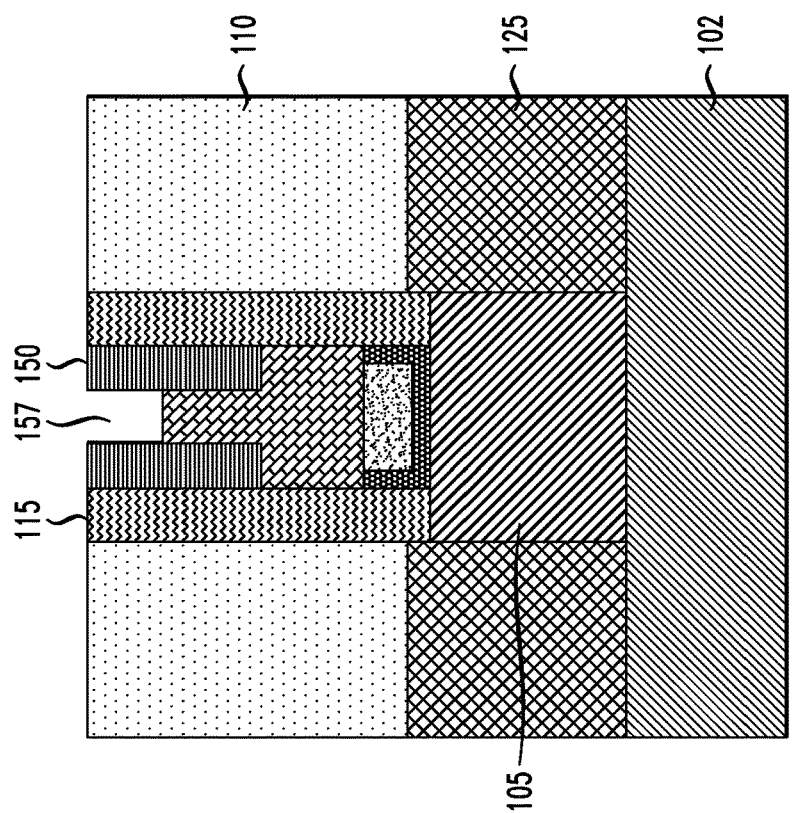

METHOD OF MANUFACTURING A SEMICONDUCTOR DEVICE HAVING A METAL GATE WITH DIFFERENT LATERAL WIDTHS BETWEEN SPACERS

BACKGROUND

When scaling for next generation semiconductor devices in connection with increased miniaturization, including, for example, very-large-scale integration (VLSI), gate resistance can be a critical issue affecting device performance. As transistors scale down, the gate resistance increases considerably and becomes the limiting factor of gate delay.

According to conventional processing, increasing a height of a gate metal leads to large levels of gate to contact (e.g., source/drain contact) parasitic capacitance. Decreasing a height of the gate metal reduces parasitic capacitance, but increases gate resistance, causing unwanted gate delay.

Accordingly, there is a need for a semiconductor device and a method of manufacturing same which reduces gate to contact capacitance without causing unwanted increases in gate resistance.

SUMMARY

According to an exemplary embodiment of the present invention, a method for manufacturing a semiconductor device includes forming a channel layer on a semiconductor substrate, and forming at least two spacers on the channel layer. In the method, a first portion of a gate metal layer is formed between the at least two spacers on the channel layer, and the first portion of the gate metal layer is recessed to a first height below top surfaces of the at least two spacers to form a first opening between the at least two spacers. The method further includes conformally depositing a dielectric layer on the at least two spacers and on the recessed first portion of the gate metal layer. The dielectric layer fills part of the first opening. Part of the dielectric layer is directionally removed from surfaces of the at least two spacers and of the recessed first portion of the gate metal layer which are parallel to an upper surface of the semiconductor substrate. A second portion of the gate metal layer is formed on the recessed first portion of the gate metal layer to fill a remaining portion of the first opening, and the second portion of the gate metal layer is recessed to a second height below top surfaces of the at least two spacers to form a second opening between the at least two spacers. A cap layer is deposited on the recessed second portion of the gate metal layer to fill in the second opening.

According to an exemplary embodiment of the present invention, a semiconductor device includes a channel layer disposed on a semiconductor substrate, and a gate metal layer disposed on the channel layer. The gate metal layer includes a second portion disposed on a first portion, and a lateral width of the second portion of the gate metal layer is less than a lateral width of the first portion. The semiconductor device further includes a plurality of spacers disposed on sides of the gate metal layer, and a dielectric layer on each of the plurality of spacer layers and positioned between the second portion of the gate metal layer and a spacer layer of the plurality of spacer layers. A cap layer is disposed on the second portion of the gate metal layer.

According to an exemplary embodiment of the present invention, a method for manufacturing a semiconductor device includes forming a channel layer on a semiconductor substrate, and forming at least two spacers on the channel layer. In the method, a first portion of a gate metal layer is formed between the at least two spacers on the channel layer, and a dielectric layer is conformally deposited on the at least two spacers and on the first portion of the gate metal layer. The method further includes directionally removing part of the dielectric layer from surfaces which are parallel to an upper surface of the semiconductor substrate. A second portion of the gate metal layer is formed between remaining portions of the dielectric layer and on the first portion of the gate metal layer, and a cap layer is deposited on the second portion of the gate metal layer between the remaining portions of the dielectric layer. A lateral width the second portion of the gate metal layer is less than a lateral width of the first portion of the gate metal layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 5 is a schematic cross-sectional view illustrating manufacturing of a semiconductor device and showing directional removal of portions of the deposited dielectric layer to form spacers, according to an embodiment of the invention.

FIG. 6 is a schematic cross-sectional view illustrating manufacturing of a semiconductor device and showing gate metal layer deposition, according to an embodiment of the invention.

FIG. 7 is a schematic cross-sectional view illustrating manufacturing of a semiconductor device and showing recessing of the gate metal layer, according to an embodiment of the invention.

FIG. 8 is a schematic cross-sectional view illustrating manufacturing of a semiconductor device and showing formation of a cap layer, according to an embodiment of the invention.

DETAILED DESCRIPTION

Figure 2:
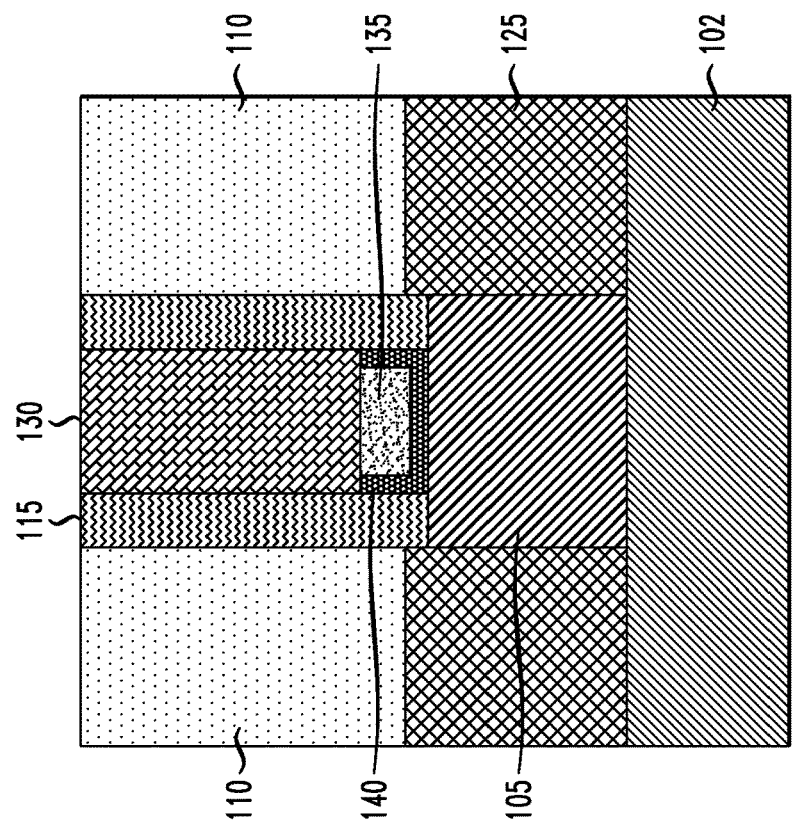
FIG. 2 is a schematic cross-sectional view illustrating manufacturing of a semiconductor device and showing dummy gate removal and formation of a gate structure, according to an embodiment of the invention.

Exemplary embodiments of the invention will now be discussed in further detail with regard to semiconductor devices and methods of manufacturing same and, in particular, to forming spacer and cap layers in place of a partially recessed gate metal layer in a gate region of a transistor in order to reduce gate resistance and gate delay.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention relate to a metal gate structure and method of forming same which reduces gate resistance and improves gate delay. More specifically, in accordance with an embodiment of the present invention, a gate metal layer is partially recessed, and spacer and cap layers are formed in place of the partially recessed gate metal layer in a gate region of a transistor. In addition to reducing gate resistance and gate delay, embodiments of the present invention also reduce gate to contact capacitance when compared with conventional structures.

Figure 1:
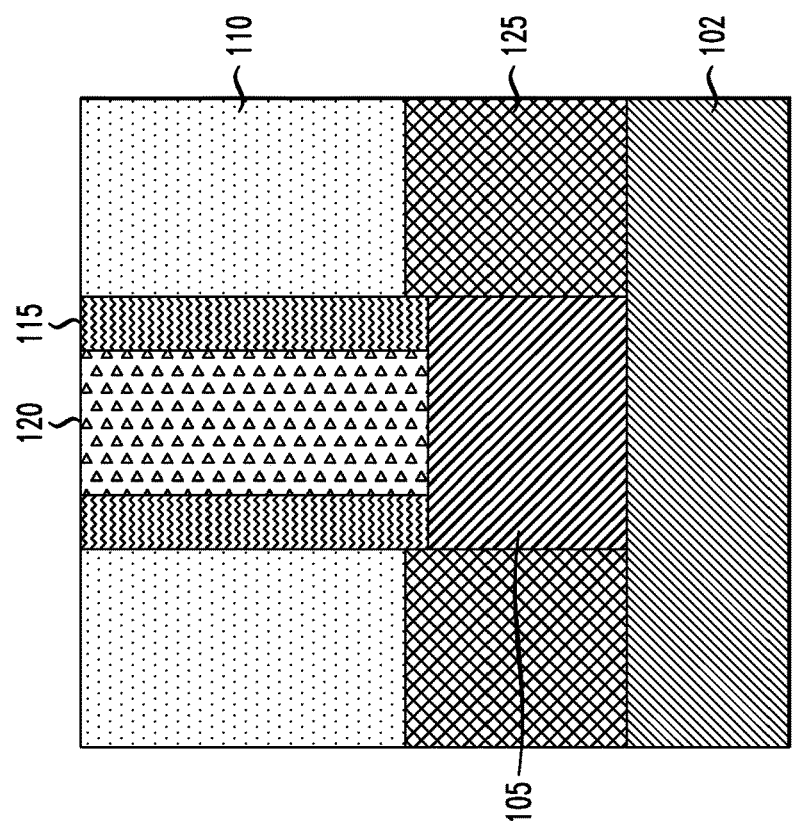
FIG. 1 is a schematic cross-sectional view illustrating manufacturing of a semiconductor device and showing formation of a dummy gate and spacers on a channel region, and formation of source/drain regions, according to an embodiment of the invention.

FIG. 1 is a schematic cross-sectional view taken perpendicular to a gate extension direction and showing formation of a dummy gate and spacers on a channel region, and formation of source/drain regions, according to an embodiment of the invention. Referring to FIG. 1, a semiconductor substrate 102 can be, for example, a bulk substrate or a silicon-on-insulator (SOI) substrate including a buried insulating layer, such as, for example, a buried oxide or nitride layer located on an upper surface of the semiconductor substrate. The substrate 102 may comprise semiconductor material including, but not limited to, Si, SiGe, SiC, SiGeC or other like semiconductor. In addition, multiple layers of the semiconductor materials can be used as the semiconductor material of the substrate.

In accordance with an embodiment of the present invention, as can be seen in FIG. 1, a channel layer 105 is formed on the substrate 102, using, for example, known methods of epitaxial growth and patterning. The structure shown in FIGS. 1-9 can be used for planar transistor device, such as, for example, a planar FET, or for another transistor device, such as, for example, a FinFET, nanowire FET or nanosheet FET. Accordingly, the channel layer 105 can be planar, or can be a fin, nanowire or nanosheet.

As is known in the art, channels can comprise, for example, silicon, and are conducting channels that extend in a direction from a source to a drain. A fin of a FinFET protrudes vertically from a substrate and extend in a direction from a source to a drain. A nanowire and a nanosheet can be suspended and extend between a source and a drain. As can be understood by one of ordinary skill in the art, a plurality of fins, nanowires or nanosheets can be formed on the substrate 102 and spaced apart from each other at regular intervals along a gate extension direction. A plurality of gates can intersect the fins, nanowires or nanosheets and extend perpendicular to the extension direction of the fins, nanowires or nanosheets. Multiple gates can be spaced apart from each other along the extension direction of the fins, nanowires or nanosheets.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a plasma-enhanced chemical vapor deposition (PECVD) apparatus. A number of different sources may be used for the epitaxial deposition of the in situ doped semiconductor material. In some embodiments, the gas source for the deposition of an epitaxially formed semiconductor material (e.g., an in situ doped semiconductor material) may include silicon (Si) deposited from silane, disilane, trisilane, tetrasilane, hexachlorodisilane, tetrachlorosilane, dichlorosilane, trichlorosilane, and combinations thereof. In other examples, when the epitaxially formed semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking. By "in-situ" it is meant that the dopant that dictates the conductivity type of the doped layer is introduced during the process step, e.g., epitaxial deposition, which forms the doped layer.

A sacrificial material, which is replaced by a gate structure, is used to determine a geometry and location of the resulting gate structure. The sacrificial gate structure 120 can comprise a material that can be selectively etched with respect to adjacent layers. For example, the sacrificial gate structure 120 may comprise silicon, such as, polysilicon, and may be deposited and patterned. The sacrificial gate structure 120 can be deposited using a deposition technique including, but not necessarily limited to, chemical vapor deposition (CVD), PECVD, radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating.

Spacers 115 are formed adjacent to the sacrificial gate structure, to be in direct contact with opposing sidewalls of the sacrificial gate structure 120. The spacers 115 can include a dielectric insulating material such as, for example, silicon oxide ($SiO_x$) (x is, for example, 1.99, 2, 2.01), carbon doped silicon oxide (SiOC), silicon nitride (SiN), silicon oxynitride (SiON), carbon doped silicon oxynitride (SiOCN), boron nitride (BN), silicon boron nitride (SiBN), silicon boron carbon nitride (SiBCN) or multilayered stacks thereof. Source/drain regions 125 are formed adjacent to the spacers 115 and the channel layer 105 by epitaxial growth with in-situ doping or by dopant implantation. The source/drain regions 125 may comprise semiconductor material including, but not limited to, Si, SiGe, SiC, SiGeC or other like semiconductor with dopants, such as, boron, phosphorus, arsenic and any other applicable elements.

An inter-layer dielectric (ILD) layer 110, comprising, for example, silicon oxide ($SiO_x$), low-temperature oxide (LTO), high-temperature oxide (HTO), flowable oxide (FOX) or some other dielectric, is formed on the source/drain regions 125 adjacent sides of the spacers 115 and on the spacers 115 and the sacrificial gate structure using a deposition process, such as, for example, CVD, PECVD, RFCVD, PVD, ALD, MBD, PLD, and/or LSMCD. The ILD layer 110, and possibly top portions of the spacers 115 and the sacrificial gate structure 120 are then planarized using a planarization process, such as, for example, chemical mechanical planarization (CMP), so that top surfaces of the ILD layer 110, spacers 115 and sacrificial gate structure 120 are level with each other, and an upper surface of the sacrificial gate structure 120 is exposed.

FIG. 2 is a schematic cross-sectional view illustrating manufacturing of a semiconductor device and showing dummy gate removal and formation of a gate structure, according to an embodiment of the invention. The sacrificial gate structure 120 is removed to provide an opening exposing a portion of the channel layer 105 between the spacers 115, and in which the resulting gate structure is to be formed. The sacrificial gate structure 120 can be removed using a selective etch process that selectively removes the sacrificial gate structure 120 with respect to the ILD layer 110 and spacers 115. The etch can be, for example, an isotropic etch, such as a wet chemical etch, or an anisotropic etch, such as RIE, ion beam etching, plasma etching or laser ablation.

A gate structure is formed in the opening left after removal of the sacrificial gate structure 120. Referring to FIG. 2, the gate structure is formed on the channel layer 105. The gate structure includes, for example, an interfacial oxide layer ($SiO_x$) (not shown) on exposed semiconductor material in the channel region, a high-K dielectric layer 140 lining a bottom and lower portions of lateral sides of the opening. The high-K dielectric layer 140 includes, but is not necessarily limited to, $HfO_x$ (hafnium oxide (e.g., $HfO_2$)), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

A work function metal (WFM) 135 comprising, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN is formed in the opening on the high-k dielectric layer 140.

According to an embodiment, after removal of the sacrificial gate structure 120, the WFM 135 and high-k dielectric layer 140 are deposited in the opening in place of the sacrificial gate structure 120, and a planarization process, such as, for example, CMP, is performed down to the ILD layers 110 to remove excess deposited WFM and high-k dielectric layers 135, 140 from the ILD layer. The WFM and high-k dielectric layers 135, 140 can be deposited using one or more deposition techniques including, but not limited to, CVD, PECVD, RFCVD, PVD, ALD, MBD, PLD, and/or LSMCD, sputtering, and/or plating.

The WFM and high-k dielectric layers 135, 140 are recessed down to the level shown in FIG. 2, and the gate metal layer 130 is formed on the recessed WFM and high-k dielectric layers 135, 140. The gate metal layer 130 includes, but is not necessarily limited to, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. The gate metal layer 130 later functions as a gate electrode and may be formed using, for example, deposition techniques including, but not limited to, CVD, PECVD, RFCVD, PVD, ALD, MBD, PLD, and/or LSMCD, sputtering, and/or plating, followed by planarization (e.g., CMP) down to the ILD layers 110. The spacers 115 are located on the gate structure, each having a first edge located on a vertical sidewall of the gate structure including the gate metal and high-k dielectric layers 130 and 140, and a base that is located on and around the channel layer 105. As can be understood by one of ordinary skill in the art, a plurality of gate structures can be formed on and around one or more channel layers 105, and spaced apart from each other along a length (e.g., extension) direction of the channel layer(s) 105.

Figure 3:
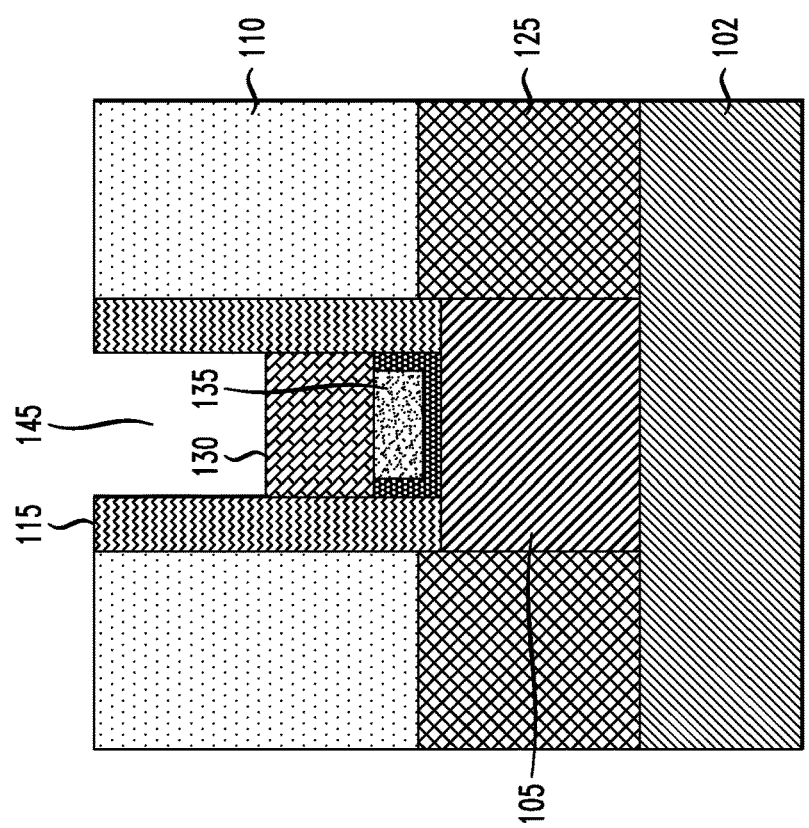
FIG. 3 is a schematic cross-sectional view illustrating manufacturing of a semiconductor device and showing recessing of a gate metal layer, according to an embodiment of the invention.

FIG. 3 is a schematic cross-sectional view illustrating manufacturing of a semiconductor device and showing recessing of a gate metal layer, according to an embodiment of the invention. Referring to FIG. 3, the gate metal layer 130 is recessed to a lower height below the top surfaces of the spacers 115 and the ILD layers 110. The recessing is performed using an etch process which selectively removes a portion of the gate metal layer 130 with respect to the ILD layer 110 and spacers 115 to form an opening 145. The etch process can be, for example, RIE using chemicals, such as, $Cl_2$, $CF_4$, $CHF_3$, $SF_6$, etc. According to an embodiment of the present invention, the gate metal layer 130 is recessed to a height of about 5 nm to about 40 nm over the WFM layer 135.

Figure 4:
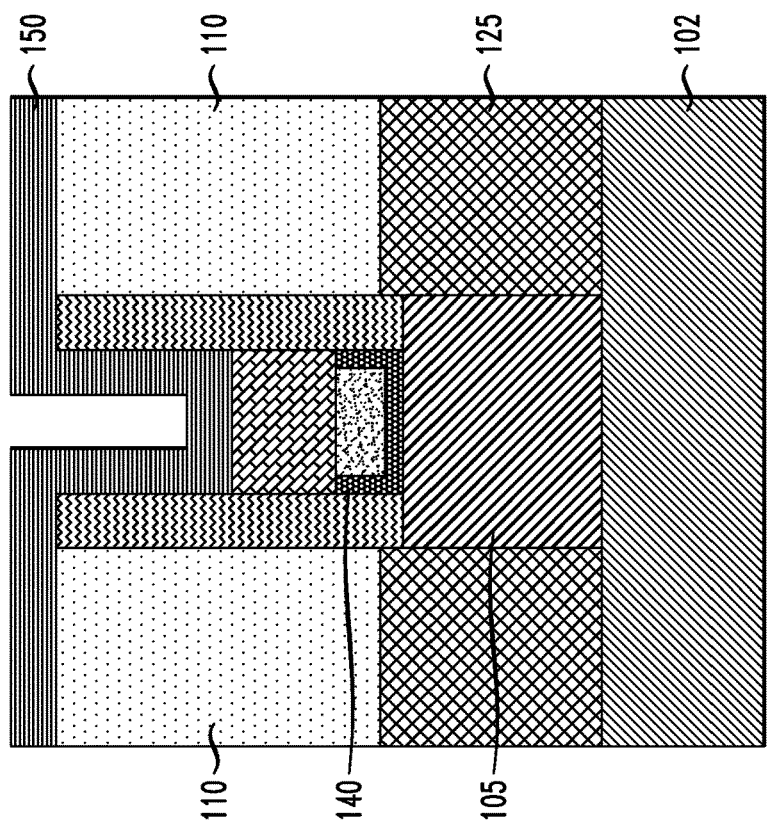
FIG. 4 is a schematic cross-sectional view illustrating manufacturing of a semiconductor device and showing deposition of a dielectric layer on the recessed gate metal layer, according to an embodiment of the invention.

FIG. 4 is a schematic cross-sectional view illustrating manufacturing of a semiconductor device and showing deposition of a dielectric layer on the recessed gate metal layer, according to an embodiment of the invention. Referring to FIG. 4, a dielectric layer 150 is conformally deposited on the ILD, spacer and gate metal layers 110, 115 and 130 using a conformal deposition process, such as, for example, ALD. The conformally deposited dielectric layer 150 can include a dielectric insulating material such as, carbon doped silicon oxide (SiOC), silicon nitride (SiN), silicon oxynitride (SiON), carbon doped silicon oxynitride (SiOCN), boron nitride (BN), silicon boron nitride (SiBN), silicon boron carbon nitride (SiBCN), which can be selectively removed with respect to the spacers 115 and ILD layer 110. A thickness of the deposited dielectric layer is in the range of, for example, about 2 nm to about 10 nm.

FIG. 5 is a schematic cross-sectional view illustrating manufacturing of a semiconductor device and showing directional removal of portions of the deposited dielectric layer to form spacers, according to an embodiment of the invention. Referring to FIG. 5, a directional etch process, such as, for example, ME, is performed to remove horizontal portions of the dielectric layer 150 with respect to the ILD, spacer and gate metal layers 110, 115 and 130. The directional etch process can be performed using, for example, RIE using chemicals, such as, $C_4F_8$, etc.

FIG. 6 is a schematic cross-sectional view illustrating manufacturing of a semiconductor device and showing gate metal layer deposition, according to an embodiment of the invention. Referring to FIG. 6, additional gate metal layer material is formed on the recessed gate metal layer 130 between the remaining portions of the dielectric layer 150 in the opening 155 (FIG. 5) to bring the gate metal layer 130 back up to a height which is level or substantially level with top surfaces of the ILD, spacer and remaining dielectric layers 150. The additional gate metal material is formed using, for example, deposition techniques including, but not limited to, CVD, PECVD, RFCVD, PVD, ALD, MBD, PLD, and/or LSMCD, sputtering, and/or plating, followed by planarization (e.g., CMP) down to the ILD layers 110 to result in the gate metal layer 130 at a height which is level or substantially level with top surfaces of the ILD, spacer and remaining dielectric layers 110, 115 and 150. According to an embodiment, the additional gate metal material is the same as the gate metal material deposited in connection with FIG. 2.

FIG. 7 is a schematic cross-sectional view illustrating manufacturing of a semiconductor device and showing recessing of the gate metal layer, according to an embodiment of the invention. Referring to FIG. 7, the gate metal layer 130 is recessed to a lower height below the top surfaces of the ILD, spacer and remaining dielectric layers 110, 115 and 150 to form an opening 157. The recessing is performed using an etch process which selectively removes a portion of the gate metal layer 130 with respect to the ILD, spacer and dielectric layers 110, 115 and 150. The etch process can be, for example, RIE using chemicals, such as, $Cl_2$, $CF_4$, $CHF_3$, $SF_6$, etc. According to an embodiment of the present invention, the gate metal layer 130 is recessed to a depth of about 5 nm to about 40 nm below the top surfaces of the ILD, spacer and dielectric layers 110, 115 and 150 or a height of about 10 nm to about 60 nm over the WFM layer 135. As can be seen in FIG. 7, the upper portion of the gate metal layer 130 between the dielectric layers 150 has a smaller lateral width than the lower portion of the gate metal layer 130 which is not between the dielectric layers 150, such that the gate metal layer 130 forms an inverted T-shape.

FIG. 8 is a schematic cross-sectional view illustrating manufacturing of a semiconductor device and showing formation of a cap layer, according to an embodiment of the invention. Referring to FIG. 8, a cap layer 160, for example, a self-aligned contact (SAC) cap layer 160 is formed in place of the recessed gate metal layer 130 in the opening 157 formed by the removal of the portion of the gate metal layer 130. In accordance with an embodiment of the present invention, the cap layer 160 comprises a dielectric insulating material and may comprise, but is not necessarily limited to, the same material as the dielectric layer 150, such as, for example, carbon doped silicon oxide (SiOC), silicon nitride (SiN), silicon oxynitride (SiON), carbon doped silicon oxynitride (SiOCN), boron nitride (BN), silicon boron nitride (SiBN), silicon boron carbon nitride (SiBCN). The cap layer 160 is formed using, for example, deposition techniques including, but not limited to, CVD, PECVD, RFCVD, PVD, ALD, MBD, PLD, and/or LSMCD, sputtering, and/or plating, followed by planarization (e.g., CMP) down to the ILD layers 110 to result in the cap layer 160 at a height which is level or substantially level with top surfaces of the ILD, spacer and remaining dielectric layers 110, 115 and 150. As can be seen in FIG. 8, the lateral width of the cap layer 160 is the same or substantially the same as the lateral width of the upper portion of the gate metal layer 130.

Figure 9:
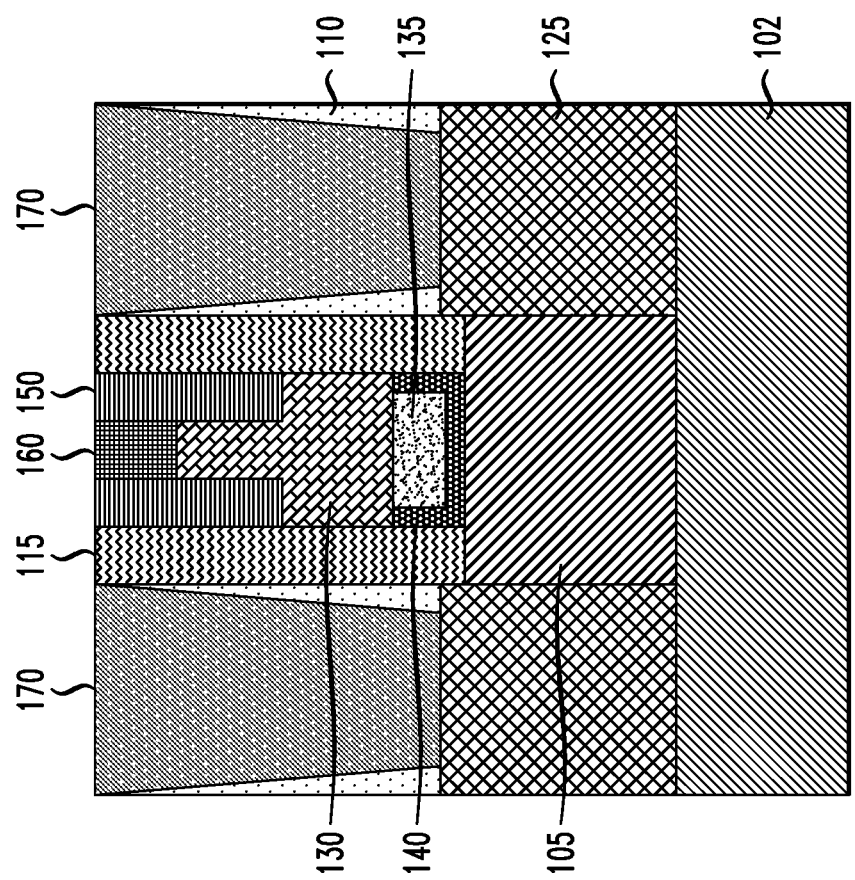
FIG. 9 is a schematic cross-sectional view illustrating manufacturing of a semiconductor device and showing formation of source/drain contacts, according to an embodiment of the invention.

FIG. 9 is a schematic cross-sectional view illustrating manufacturing of a semiconductor device and showing formation of source/drain contacts, according to an embodiment of the invention. Referring to FIG. 9, contacts 170 to source/drain regions on the sides of the gate structure including the gate metal, WFM and high-k dielectric layers 130, 135 and 140 are formed by etching trenches through the ILD layer 110 to reach source/drain regions 125, and then filling the trenches with a contact material, such as, for example, electrically conductive material including, but not necessarily limited to, tungsten, cobalt, zirconium, tantalum, titanium, aluminum, ruthenium, and/or copper. A silicide/germanide layer may be formed in the trenches on the source/drain regions 125 by, for example, silicidation (e.g., formation of an alloy including a portion of a contact material with an underlying silicon or germanium layer), before filling the trenches with a remainder of electrically conductive material.

In accordance with embodiments of the present invention, the structure including the cap layer 160, the dielectric layers 150, and the inverted T-shaped gate metal layer 130 reduces gate resistance by, for example, about 25% over conventional structures, and reduces gate delay.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method for manufacturing a semiconductor device, comprising:
    forming a channel layer on a semiconductor substrate;
    forming at least two spacers on the channel layer;
    forming a first portion of a gate metal layer between the at least two spacers on the channel layer;
    recessing the first portion of the gate metal layer to a first height below top surfaces of the at least two spacers to form a first opening between the at least two spacers;
    conformally depositing a dielectric layer on the at least two spacers and on the recessed first portion of the gate metal layer, wherein the dielectric layer fills part of the first opening;
    directionally removing part of the dielectric layer from surfaces of the at least two spacers and of the recessed first portion of the gate metal layer which are parallel to an upper surface of the semiconductor substrate;
    forming a second portion of the gate metal layer on the recessed first portion of the gate metal layer to fill a remaining portion of the first opening;
    recessing the second portion of the gate metal layer to a second height below top surfaces of the at least two spacers to form a second opening between the at least two spacers; and
    depositing a cap layer on the recessed second portion of the gate metal layer to fill in the second opening;
    wherein a lateral width of an entirety of the recessed second portion of the gate metal layer is less than a lateral width of the recessed first portion of the gate metal layer.

2. The method according to claim 1, further comprising:
    forming a plurality of source/drain regions adjacent the channel layer; and
    forming an inter-layer dielectric (ILD) layer on the plurality of source/drain regions, wherein each of the at least two spacers is positioned on the channel layer between the ILD layer and the recessed first and second portions of the gate metal layers.

3. The method according to claim 2, further comprising forming at least one source/drain contact through the ILD layer.

4. The method according to claim 1, wherein the second height is different from the first height.

5. The method according to claim 1, wherein the recessed second portion of the gate metal layer on the recessed first portion of the gate metal layer forms an inverted T-shape.

6. The method according to claim 1, wherein a lateral width of the cap layer is the same or substantially the same as the lateral width of the recessed second portion of the gate metal layer.

7. The method according to claim 1, wherein a work function metal layer is under the recessed first portion of the gate metal layer.

8. The method according to claim 7, wherein a high-k dielectric layer is under the work function metal layer.

9. The method according to claim 1, wherein a material of the cap layer is the same as a material of the dielectric layer.

10. The method according to claim 1, wherein the channel layer comprises at least one of a fin, a nanowire and a nanosheet.

11. A method for manufacturing a semiconductor device, comprising:
    forming a channel layer on a semiconductor substrate;
    forming at least two spacers on the channel layer;
    forming a first portion of a gate metal layer between the at least two spacers on the channel layer;
    conformally depositing a dielectric layer on the at least two spacers and on the first portion of the gate metal layer;
    directionally removing part of the dielectric layer from surfaces which are parallel to an upper surface of the semiconductor substrate;
    forming a second portion of the gate metal layer between remaining portions of the dielectric layer and on the first portion of the gate metal layer; and
    depositing a cap layer on the second portion of the gate metal layer between the remaining portions of the dielectric layer;
    wherein a lateral width of an entirety of the second portion of the gate metal layer is less than a lateral width of the first portion of the gate metal layer.

12. The method according to claim 11, further comprising:
    forming a plurality of source/drain regions adjacent the channel layer; and
    forming an inter-layer dielectric (ILD) layer on the plurality of source/drain regions, wherein each of the at least two spacers is positioned on the channel layer between the ILD layer and the first and second portions of the gate metal layers.

13. The method according to claim 12, further comprising forming at least one source/drain contact through the ILD layer.

14. The method according to claim 11, wherein the second portion of the gate metal layer on the first portion of the gate metal layer forms an inverted T-shape.

15. The method according to claim 11, wherein a lateral width of the cap layer is the same or substantially the same as the lateral width of the second portion of the gate metal layer.

16. The method according to claim 11, wherein a work function metal layer is under the first portion of the gate metal layer.

17. The method according to claim 16, wherein a high-k dielectric layer is under the work function metal layer.

18. The method according to claim 11, wherein a material of the cap layer is the same as a material of the dielectric layer.

19. The method according to claim 11, wherein the channel layer comprises at least one of a fin, a nanowire and a nanosheet.

* * * * *